Figure 1:
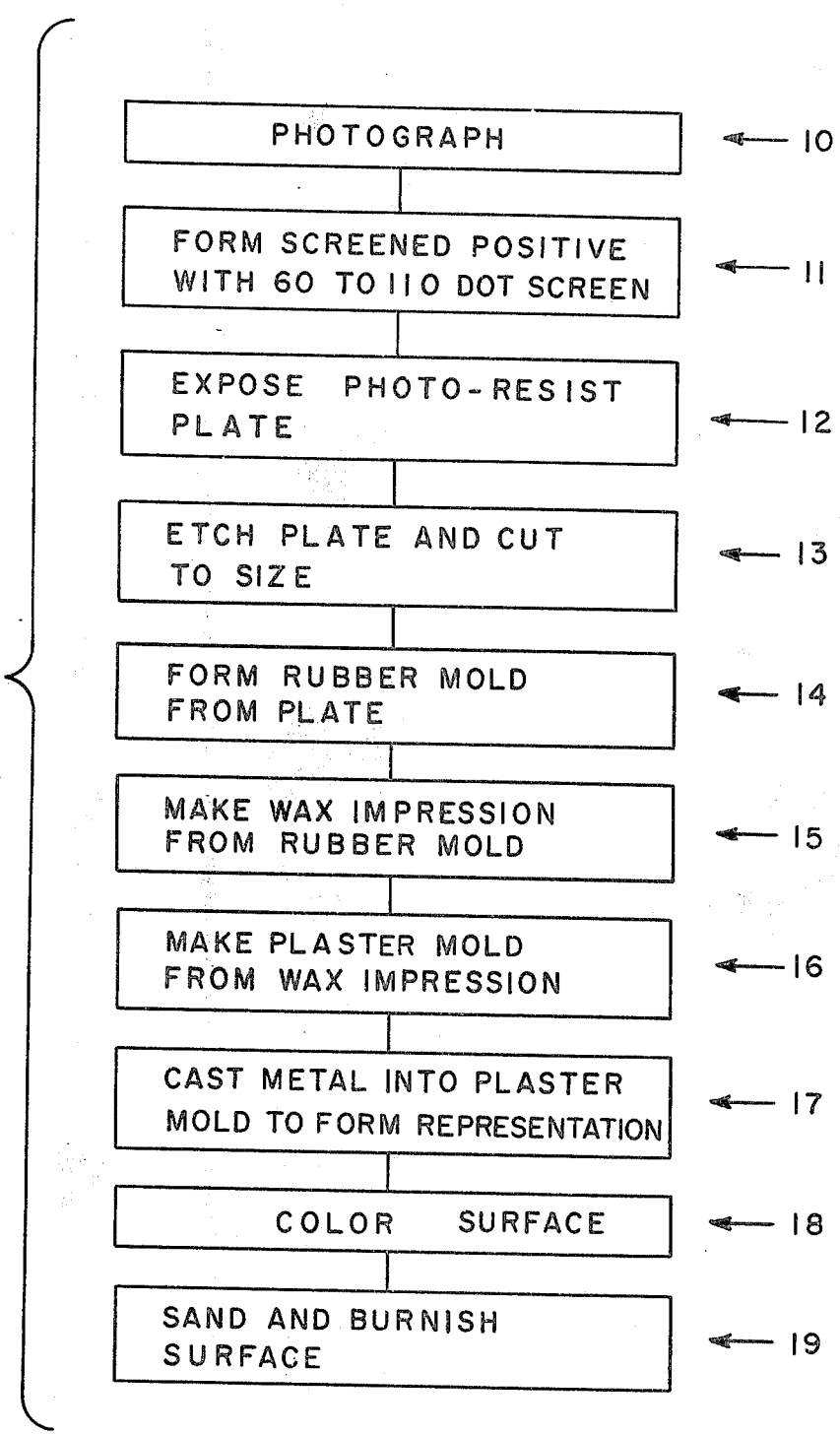

United States Patent [19]

Barker

[11] 4,254,544
[45] Mar. 10, 1981

[54] METHOD OF CASTING PHOTOGRAPHIC REPRESENTATION HAVING TONAL AND HEIGHT CONTRASTS AND THE ARTICLE SO CAST

[76] Inventor: Michael D. Barker, Bow St., Northwood, N.H. 03261

[21] Appl. No.: 917,707

[22] Filed: Jun. 21, 1978

[51] Int. Cl.³ .......................................... B22D 11/126
[52] U.S. Cl. .................. 29/527.3; 29/527.5; 29/527.6; 29/527.1; 29/160.6; 164/34; 164/2
[58] Field of Search ............... 29/160.6, 527.5, 527.6, 29/527.3, 527.1, 527.2; 164/34, 2, 3

[56] References Cited

U.S. PATENT DOCUMENTS

| | | | |
|---|---|---|---|
| 467,268 | 1/1892 | Welling | 29/160.6 |
| 2,118,468 | 5/1938 | Jungersen | 29/160.6 X |
| 3,537,958 | 11/1970 | Wreun et al. | 204/18 |
| 3,659,327 | 5/1972 | Beverick et al. | 29/160.6 |
| 4,063,346 | 12/1977 | Simpson et al. | 29/527.7 |

Primary Examiner—Francis S. Husar
Assistant Examiner—V. K. Rising
Attorney, Agent, or Firm—Thomas L. Tully

[57] ABSTRACT

The method of casting a representation of a photograph that includes forming an etched plate through a half-toned screen of the photograph, making a mold cavity of the plate, making a wax impression of the rubber mold with the wax impression not completely copying the rubber mold, forming a casting of the wax impression, coloring the surface of the casting and sanding and burnishing the surface to remove the coloring from the high areas to produce a cast surface having tonal and height contrasts.

4 Claims, 2 Drawing Figures

METHOD OF CASTING PHOTOGRAPHIC REPRESENTATION HAVING TONAL AND HEIGHT CONTRASTS AND THE ARTICLE SO CAST

In U.S. Pat. No. 3,659,327, there is disclosed a method of producing a metal casting having a pictorial representation of a photograph. The method disclosed has the steps of making a negative of the photograph with shading and background color eliminated, photoengraving or etching of the negative on a metal plate, producing a rubber mold from the etched plate and through the lost wax process casting the representation. Further, there is taught that the finished cast article should have its recessed portion essentially filled in by a material having different color than the cast metal.

U.S. Pat. No. 3,537,958 discloses forming a photographic representation in metal by first forming a screened half-tone of the photograph forming a screened negative transparency from the screened positive and then photo-etching a metallic plate from the negative. The plate is formed into the finished article by providing a contrasting coating in the etched recesses.

While both of the above patents disclose methods which may produce satisfactory articles, neither produces an article in which not only are tones of the original photograph preserved but also in which the finished article has a height contrast or relief that is related to the tones. Thus, while both provide for color contrast, there is no provision for forming in the representations, variations in height in the cast representation which exist for example, in a coin.

It is accordingly an object of the present invention to cast a representation of a photograph in metal which has surface heights or relief that are related to the tones in the photograph.

Another object of the present invention is to achieve the above object and further to also provide tones on the cast surface thereby providing both tonal and depth contrasts in the finished cast representation.

A further object of the present invention is to provide a cast representation of a photograph which while having tonal and height contrasts, is essentially as economical to manufacture as a representation that merely has tonal contrasts.

In carrying out the present invention, many of the steps recited in the above-noted patents are essentially followed in that a photo-etched plate is formed of the photograph and a rubber mold cavity copies the etched plate. Subsequently, a wax impression is made of the rubber mold cavity and then the representation is cast by the lost wax process.

However, in the present method, the photo-etched plate is made using a half-tone screen having a mesh within a range of perhaps 60 to 110 dots per inch with 80 being found satisfactory. Though the rubber mold cavity copies precisely the etched plate, the wax impression does not copy the cavity as wax does not flow completely into each small depression in the mold cavity. It has been found that the wax when filling the cavity, traps air in the depressions which prevents precise copying of the depressions with the deeper depressions corresponding to the black areas in the photograph being less copied than the smaller depressions that correspond to the lighter areas. Thus, the average height of the areas in the wax impression become related to the tone contrast of the photograph with the photograph black areas on the wax impressions being recessed below the photograph white areas on the impression.

When the representation is cast from the wax impression, the cast impression copies the impression to thus have the different heights. The representation may be completed by having coloring tones applied as by oxidation of silver when silver is the cast metal and then sanding and burnishing or polishing by hand with a substance as is used in the jewelry trade such as tripoli, to remove the coloration from the high areas while leaving the coloration in the low areas with the burnishing smoothing and somewhat flattening the protrusions resulting from the half-tone screen.

Other features and advantages will hereinafter appear.

In the drawing:

FIG. 1 is a flow chart of the steps of the method of the present invention.

Figure 2:
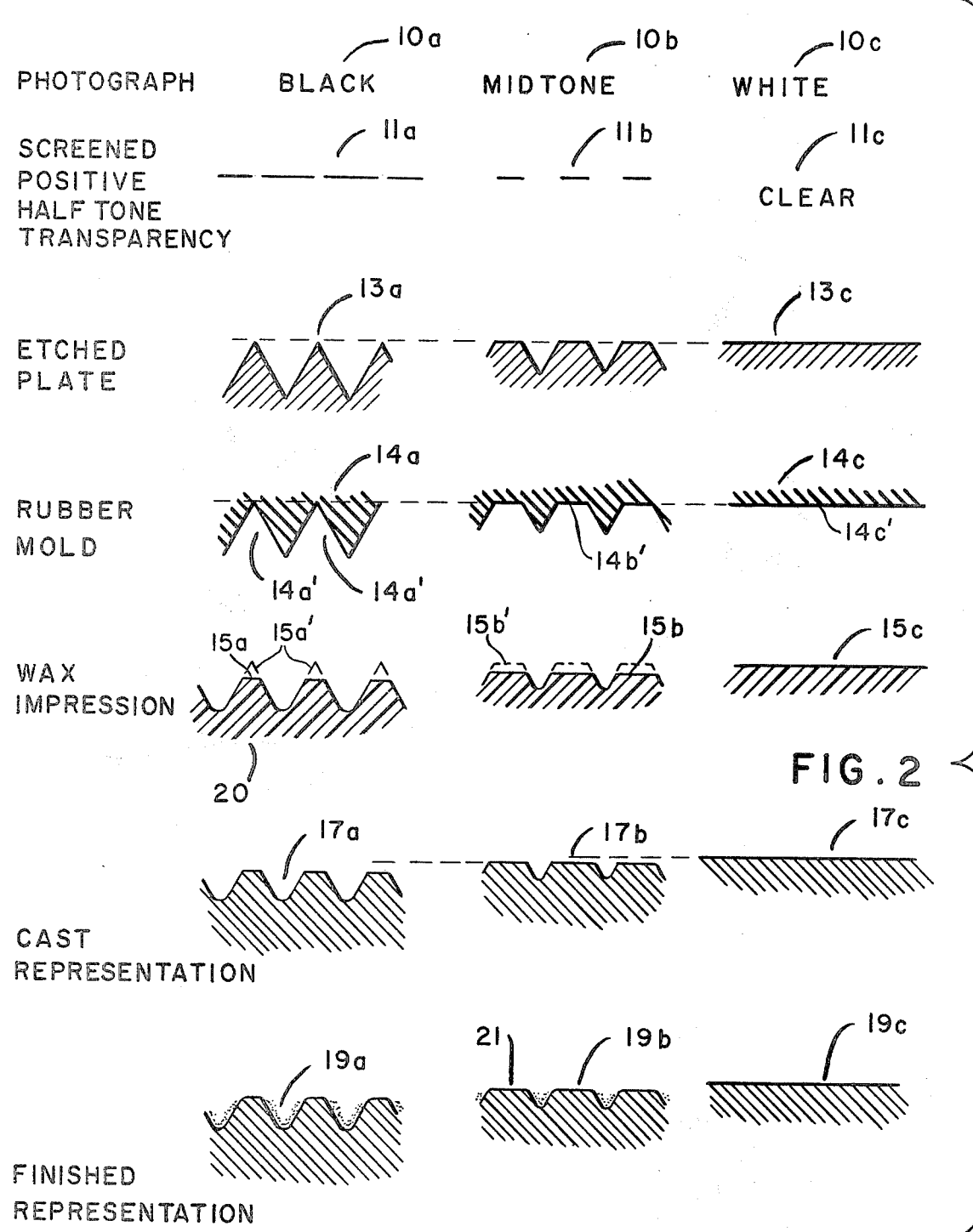

FIG. 2 consists of illustrations of a plurality of surfaces that occur as a result of the method with the surfaces being enlarged for clarity.

Referring to the drawing, there is initially provided a photograph indicated by the block 10 with the photograph either being in a colored or a black and white print or a negative thereof and from the photograph, a screened positive transparency is made using a 60 to 110 dots per inch half-tone screen as indicated by a block 11. An etching plate, which may be made of magnesium or other etchable metal that is covered by photo-resistive material, is then exposed to the screened positive and the plate is etched to remove metal from the plate where the positive does not leave resistive material on the plate. The areas etched on the plate correspond to the black areas on the positive transparency. The etched plate is then cut to the size desired in the finished article which for example, may be an oval shape or a round shape on the order of, for example, a half dollar. It is also noted that the cutting to size may include a border having resistive material if it is desired to provide a raised border about the edge of the cast representation. These last steps are indicated in the blocks 12 and 13 on the drawing.

The above described steps are taught in above-noted U.S. Pat. No. 3,659,327 and are the steps that are conventionally employed in the printing industry to form a printing plate of a photograph with the exception that the etched plate has a positive image so that the white areas of the photograph are raised, not etched, rather than the black areas.

With the plate so etched and cut, the next step in the method of the present invention is to form a rubber mold of the plate in a conventional manner so that when the mold is opened and the etched plate removed, the cavity found in the mold will be essentially identically to the configuration of the etched plate. This step is indicated in block 14. Subsequently, as indicated by block 15, a wax impression is made in the cavity of the rubber mold. From the wax impression, by the use of a lost wax process, as indicated by the block 16 which includes making a jewelry investment or plaster cast of the wax impression, metal is cast into the plaster mold to form the representation as indicated by the block 17. The steps indicated by the blocks 14, 15, 16 and 17 are essentially identical to those disclosed in U.S. Pat. No. 3,659,327 and are fairly conventional techniques in forming a cast article of an etched plate.

After the metal has hardened and been removed from the plaster mold, the surface of the article is colored as for example, if the cast metal is silver by the oxidation of the silver surface to produce a black surface throughout the extent of the surface. The surface is then sanded with very fine sandpaper or tumbled with somewhat large blocks of fine grid abrasive to remove the coloration from the high points of the surface and expose the cast metal. Subsequently the surface is burnished as by tumbling with small pieces of hard metal or polished with tripoli and/or jeweler's rouge.

the finished surface of the cast article will accordingly have the coloration removed from the high surfaces to expose the base metal but it is left in the low areas thereby providing tonal color to the cast representation by having shades of light and dark areas. In addition however, the burnishing tends to somewhat smoothen the screen caused protrusions to provide coin-like heights in the finished representation.

Referring to FIG. 2, there are shown enlarged illustrations of the different structures that occur during the present method for a black area in the photograph, a mid-tone area and a white area as indicated by the reference numerals 10a, 10b and 10c respectively. The subsequent illustrations vertically aligned under each of the three areas are those that occur in the method for such areas in the photograph. In the screened positive halftone transparency, each black area 11a is also black but with small dots, with the dots being those produced by the screen while each white area 11c is a solid white area without interruptions which is herein indicated by the word "clear". The mid-tone area 11b is basically half black and half white.

The etched plate for each black area illustration 13a has substantial portions removed by etching with only the surface of the plate that corresponds to the white areas on the screened positive half-tone transparency remaining at the upper surface of the etched plate. In the white illustration 13c, there is no material etched away from the surface of the plate so that the plate surface is flat. It will be noted that as is conventional in the etching of a plate, the etching seems to progress to provide somewhat conical indentations being related to the size of the entrance of the indentations which in turn depends upon the extent of the black area in the screened positive.

The etched plate is then used to form an impression in a rubber mold by vulcanizing or otherwise hardening the mold around the plate and the rubber mold cavity, as shown, copies negatively but precisely the surfaces of the plate. Thus, as shown in illustration 14a, the rubber mold has deep conical depressions 14a' while the illustration 14c has no depressions. After the rubber mold has been vulcanized or otherwise hardened and then cut to enable removal of the etched plate, liquid wax is injected into the rubber mold cavity in a conventional manner with the wax being injected under the typical pressure of 5 to 20 PSI.

I have found that if the half-tone screen is within the range of 60-110 dots per inch with 80 being found preferred, that the full extent of each of the depressions formed in the rubber mold cavity are incapable of being exactly copied by the wax impression. Thus, as illustrated the formed wax impression 20 has raised areas 15c corresponding to the surface 14c' of the rubber mold but has intermediate raised areas 15b and minimum raised areas 15a which are not accurate copies of recesses 14b' and 14a' of the rubber mold since air was trapped in said recesses during formation of the wax impression thereby preventing formation of the peak areas 15b' and 15a', shown by means of broken lines. This causes the formed wax impression to have raised areas of different heights corresponding to the toned areas of the original photograph.

It has been found that the reason for this failure of the wax to exactly copy the rubber mold cavity is caused by the entrapment of air in the depression during the filling of the cavity. Thus, air trapped in the bottom of each depression prevents the wax from completely filling the depression. As shown in illustration 15c, there are no depressions and thus the wax will follow exactly the rubber mold cavity surface while in the illustration 15b, the wax somewhat essentially copies the mold surface but yet there is some entrapment of air.

It should be noted that in all the horizontally aligned illustrations that those portions of the surfaces that are horizontally aligned are at the same horizontal level on the surface of the item depicted. In the illustrations 15a, 15b, and 15c, the surface of the wax impression in the illustration 15c is higher than the average surface of the impression 15b which in turn is higher than the average surface of the illustration 15a so that the wax impression accordingly provides depth differences which are related to the tone in the photograph with the black areas having less height, i.e. being recessed below the height of the white areas.

The cast article when following the steps set forth in blocks 16 and 17 will essentially faithfully copy the wax impression and thus the average surface shown by the illustration 17a will be lower than the flat surface depicted by the illustration 17c with the mid-tone areas shown in the illustration 17b being spaced inbetween.

The complete surface of the cast representation is then provided with a colored coating with preferably, as when the cast material is silver, being a coating that is formed by oxidizing the silver, to provide a black contrast to the underlying silver base metal. For finishing the article, the colored cast article is preferably tumbled with pellets that may be on the order of ⅛ inch diameter and formed of fine abrasive material which removes or sands away the oxidation or coloring from the higher surfaces of the representation while leaving the coloring in the low areas. The remaining colored material is shown as dots in illustrations 19a and 19b and indicated by the reference numeral 21.

Subsequently, the article may be further tumbled with hardened metal balls or small rods of perhaps ¼ inch in diameter, in order to somewhat smooth or blunt the peaks of projections on the surface. Such burnishing tends to provide somewhat greater height definition in the finished representation. The final step, whether the article is burnished or not, is polishing the exposed base metal to render it shiny.

It will thus be understood that in the finished representation, the surface in the illustration 19c which represents the white portions of the photograph, is caused to be shiny and of a higher level than the mid-tone portion shown in representation 19b which has portions that are both colored and shiny, which in turn are again higher than the illustration 19a of the black surfaces, the latter being essentially completely covered by colored material with only small spots of base metal being exposed. The finished article accordingly provides a surface which not only has tones that correspond to the original photograph but in addition, the surface of the represenataion provides depths that are related to the tones, it being noted that the black areas are recessed below the white areas as shown by the horizontal alignment of illustrations 19a, 19b and 19c. Thus, the finished representation not only has coloration corresponding to the tones of the photograph but also achieves height levels that are related to the tones to provide a three dimensional or sculptured effect to the surface of the representation.

It has been found that if screens of lesser than 60 mesh are employed, that the depressions 14a' of illustration 14a, for example, have such a size that the wax may flow therewithin and thus copy the rubber mold exactly without entrapment of air while also causing loss of definition in the representation while screens having greater than 110 lines per inch cause the depressions 14a' in illustration 14a to be so small that very little relief is obtained.

The kind of rubber or other flexible material that is vulcanized or solidified to form the mold and the wax employed have not been found to be especially critical. However, it is noted that Romanoff's NEO-BROWN rubber and Romanoff's Master Wax available from the Romanoff Rubber Company, New York, N.Y., has been found satisfactory. It is also noted that the forming of the colored surfaces by oxidation may employ an oxidizing agent sold under the name "SILVOX" from Allcraft Tool And Supply Co. Inc., Hicksville N.Y.

While the preferred embodiment produces coloring by oxidation of the base metal, if desired, other coloring material may be employed as is well-known in the jewelry art.

It will accordingly be understood that there has been disclosed a method of producing a cast representation of a photograph and the article so produced. The representation is formed of an exposed base metal and contrasting colored material thereon with the extent of the colored areas corresponding to dark areas of the photograph to thus provide tones in the representation similar to tones of the photograph. Moreover, the representation has a three dimensional contoured surface with the extent of the heights being related to the tone so that areas corresponding to the white areas in the photograph project the most, while areas corresponding to the black areas in the photograph are recessed therebelow.

Variations and modifications may be made within the scope of the claims and portions of the improvements may be used without others.

I claim:

1. The method of producing a cast metal representation of a photograph having light-colored areas and color tones comprising medium-colored areas and dark-colored areas, said representation having height contrasts corresponding to the color tones of said photograph comprising the steps of forming a half-tone positive transparency of said photograph using a 60 to 110 mesh half-tone screen, exposing a photo-resistive coating present on a metallic etching plate to light passed through said half-tone positive, removing the unexposed areas of the photo-resistive coating and etching the metallic plate underlying said areas to produce an etching plate having etched recesses corresponding to the toned areas of said photograph, producing a mold of the etched surface of said etching plate, said mold having raised areas corresponding in height to the depth of said recessed etched areas and having recessed areas corresponding in depth to the height of the non-etched areas of said etching plate, making a wax impression of said mold to cause the wax to enter said recessed mold areas and to trap air at the base of said recessed areas whereby said wax impression of said mold has raised areas of lesser height than the depth of the recessed ares of said mold and has recessed areas having a depth corresponding to the height of the raised areas of the mold, the areas corresponding to the light-colored areas of said photograph having a maximum height, the areas corresponding to the medium-colored areas of said photograph having an intermediate height surrounding recesses of intermediate depth and the areas corresponding to the dark-colored areas of said photograph having a minimum height surrounding recesses of maximum depth, forming a casting mold from said wax impression and forming a metal representation of said photograph in said casting mold, said metal representation comprising raised or relief areas of maximum height corresponding to the light-colored areas of the photograph, raised or relief areas of intermediate height corresponding to the medium-colored areas of the photograph and non-raised areas corresponding to the dark-colored areas of the photograph.

2. The invention as defined in claim 1 in which the cast representation has higher and lower height areas and in which there is the step of coloring the surfaces of the lower height areas with a coloring material.

3. The invention as defined in claim 2 in which there is the step of exposing the cast metal at higher height areas and in which the step of coloring the lower height areas uses a color material that contrasts with the color of the cast metal.

4. The invention as defined in claim 3 in which there is the step of polishing at least the higher height areas of the representation.

* * * * *

UNITED STATES PATENT AND TRADEMARK OFFICE
CERTIFICATE OF CORRECTION

PATENT NO. : 4,254,544
DATED : March 10, 1981
INVENTOR(S) : Michael D. Barker

It is certified that error appears in the above—identified patent and that said Letters Patent is hereby corrected as shown below:

Col. 2, line 46, U. S. Patent No. "3,659,327" should be -- 3,537,958 --.

Col. 6, line 20, "ares" should be -- areas --.

Signed and Sealed this

Second Day of June 1981

[SEAL]

*Attest:*

RENE D. TEGTMEYER

*Attesting Officer*     *Acting Commissioner of Patents and Trademarks*